(12) United States Patent
Lee et al.

(10) Patent No.: US 11,685,055 B2
(45) Date of Patent: Jun. 27, 2023

(54) ROBOT GRIPPER FOR MOVING WAFER CARRIERS AND PACKING MATERIALS AND METHOD OF OPERATING THE SAME

(71) Applicant: TAIWAN SEMICONDUCTOR MANUFACTURING COMPANY LTD., Hsinchu (TW)

(72) Inventors: Chien-Fa Lee, Hsinchu (TW); Feng-Kuang Wu, Hsinchu County (TW); Fu-Cheng Hung, Tainan (TW); Chi-Wei Chen, Hsinchu (TW); Chih-Hua Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 364 days.

(21) Appl. No.: 17/002,497

(22) Filed: Aug. 25, 2020

(65) Prior Publication Data

US 2021/0331327 A1    Oct. 28, 2021

Related U.S. Application Data

(60) Provisional application No. 63/016,870, filed on Apr. 28, 2020.

(51) Int. Cl.
| | | |
|---|---|---|
| *B25J 11/00* | (2006.01) | |
| *B65B 69/00* | (2006.01) | |
| *H01L 21/673* | (2006.01) | |
| *B25J 15/00* | (2006.01) | |

(52) U.S. Cl.
CPC ....... *B25J 11/0095* (2013.01); *B25J 15/0014* (2013.01); *B25J 15/0028* (2013.01); *B25J 15/0052* (2013.01); *B65B 69/00* (2013.01); *H01L 21/67379* (2013.01)

(58) Field of Classification Search
CPC ............... B25J 11/0095; B25J 15/0014; B25J 15/0028; B25J 15/0052; B25J 15/0253; B65B 69/00; H01L 21/67379; H01L 21/67386; H01L 21/68707
See application file for complete search history.

(56) References Cited

U.S. PATENT DOCUMENTS

| | | | | |
|---|---|---|---|---|
| 5,024,575 | A * | 6/1991 | Anderson | B65G 47/90 |
| | | | | 414/737 |
| 5,338,150 | A * | 8/1994 | Focke | B65G 47/90 |
| | | | | 414/792.9 |
| 6,592,324 | B2 * | 7/2003 | Downs | B25J 15/0253 |
| | | | | 414/730 |
| 9,695,019 | B1 * | 7/2017 | Huang | B66C 1/22 |
| 10,556,338 | B1 * | 2/2020 | Marchese | B25J 9/1612 |
| 10,654,176 | B2 * | 5/2020 | Jonas | B25J 15/0028 |

FOREIGN PATENT DOCUMENTS

JP         3697478 B2 *  9/2005  ....... H01L 21/67379

\* cited by examiner

*Primary Examiner* — Stephen A Vu
(74) *Attorney, Agent, or Firm* — WPAT Law; Anthony King

(57) ABSTRACT

A robot gripper for moving wafer carriers and packing materials and a method of operating the same are provided. The robot gripper includes two opposing clamp assemblies. The two clamp assemblies are configured to move close to or away from each other. Each of the clamp assemblies includes a movable support pin at a bottom of the clamp assembly.

20 Claims, 17 Drawing Sheets

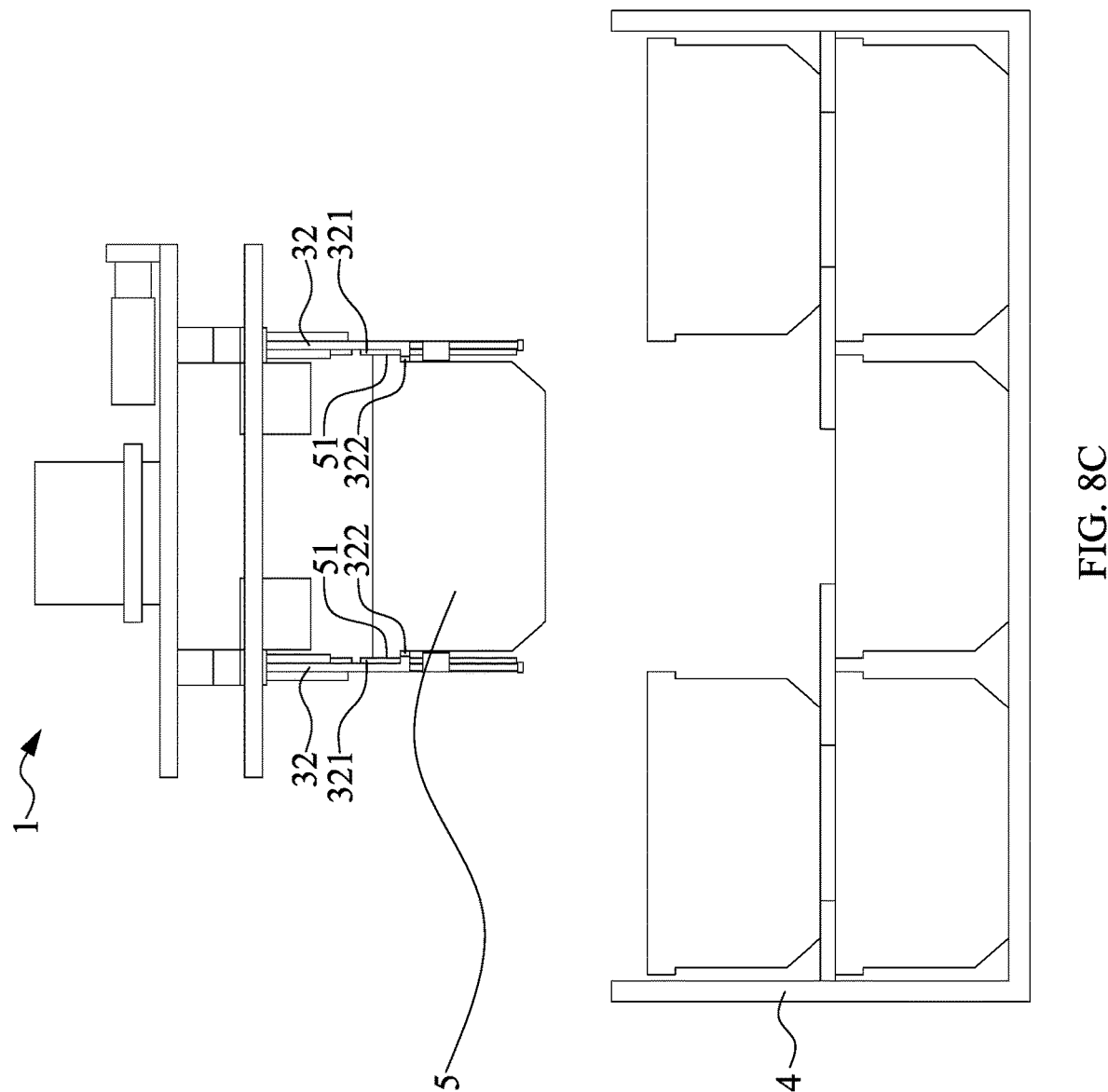

ROBOT GRIPPER FOR MOVING WAFER CARRIERS AND PACKING MATERIALS AND METHOD OF OPERATING THE SAME

PRIORITY CLAIM AND CROSS-REFERENCE

This application claims priority of U.S. provisional application Ser. No. 63/016,870 filed on Apr. 28, 2020, which is incorporated by reference in its entirety.

BACKGROUND

Front-opening shipping boxes (FOSBs) are generally used to ship wafers from wafer suppliers to their customers. A FOSB may also be used within/between integrated circuits (IC) manufacturing facilities and to/from IC manufacturers. A FOSB may further be used to transfer product from an IC manufacturing facility to suppliers or customers.

When the front-opening shipping boxes (FOSBs) are transported to the customer, the FOSBs are packed in a packing container and a packing material is covered on the FOSBs such that the FOSBs are held fixedly and prevented from the impact. Typically, the customer should use two different types of robot grippers to remove the packing material and the FOSB from the packing container.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8B and FIG. 8C illustrate a method of removing a wafer carrier from a packing container, in accordance with some embodiments of the present disclosure.

DETAILED DESCRIPTION

Figure 1:
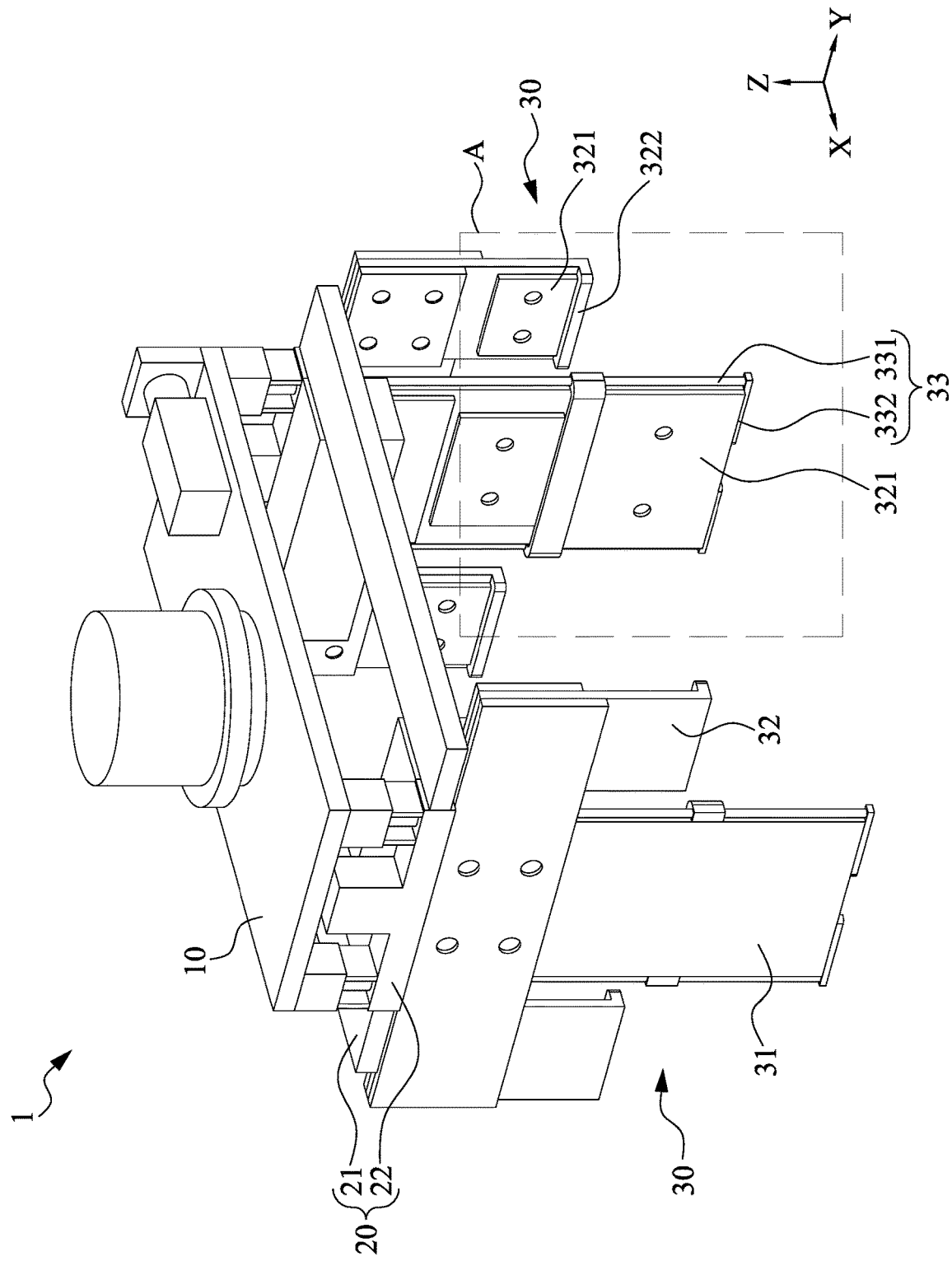
FIG. 1 is a perspective view of a robot gripper in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly." "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Generally, the wafer suppliers use Front-opening shipping boxes (FOSBs) to ship wafers to the customers. The wafers are loaded in the FOSBs and the FOSBs are packaged in a packing container. The suppliers usually further puts soft and/or flexible packing materials on the FOSBs packaged in the packing container such that the FOSBs could be fixed in the packing container and be prevented from damage. Thus, after the customers receive the packing container with the FOSBs from the wafer suppliers, the customers should remove the packing materials from the packing container and then take the FOSBs out of the packing container.

Present disclosure provides a robot gripper that is configured to pick up the wafer carrier, such as the FOSB, and the packing material and to move the wafer carrier and the packing material. The user can use such single robot gripper to remove the packing materials from the packing container and take the FOSBs out of the packing container.

Figure 2:
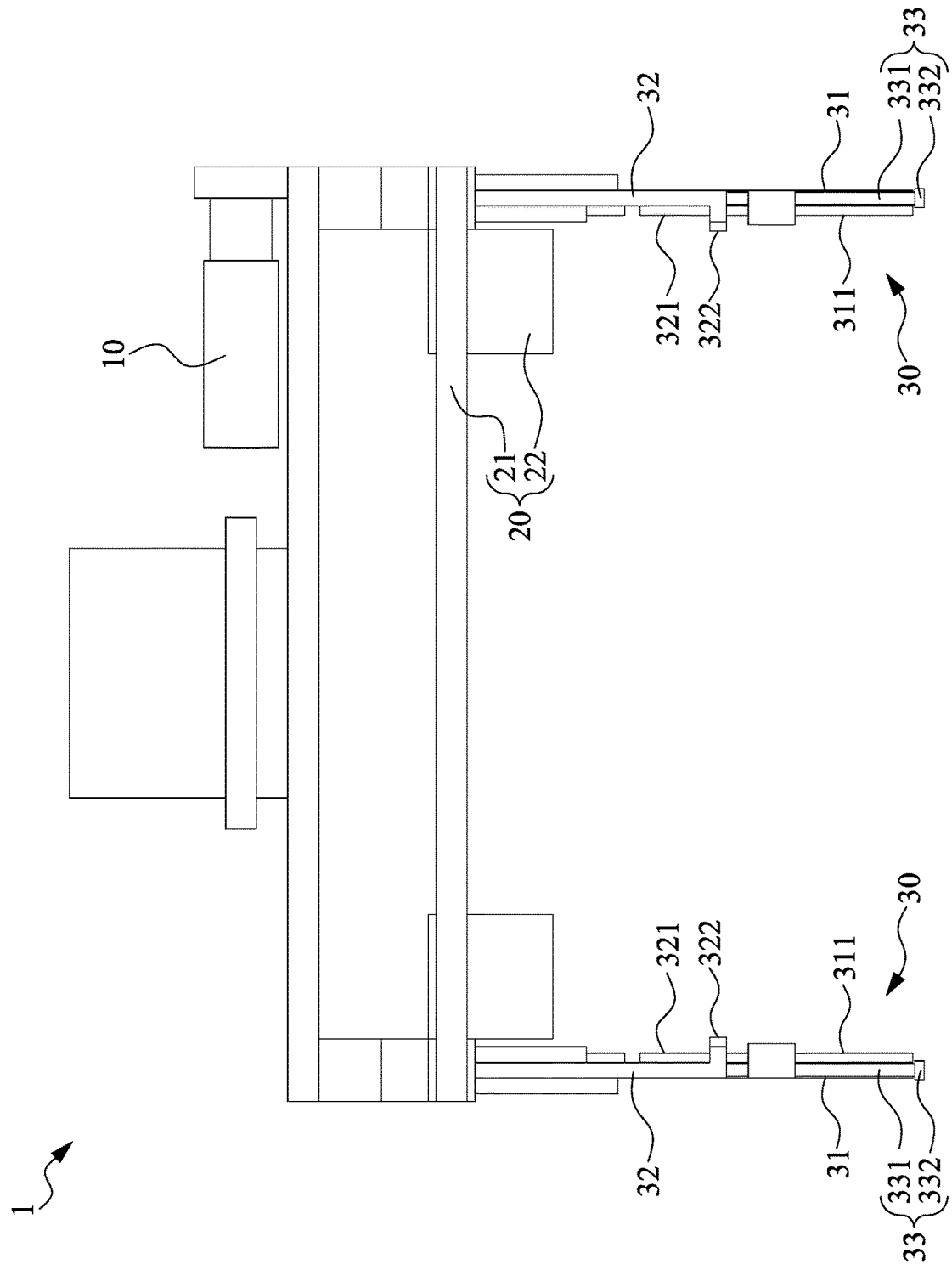
FIG. 2 is a schematic front view of a robot gripper in accordance with some embodiments of the present disclosure.

FIG. 1 is a perspective view of a robot gripper in accordance with some embodiments of the present disclosure. FIG. 2 is a schematic front view of a robot gripper in accordance with some embodiments of the present disclosure. The robot gripper 1 includes a main body 10, a transmission assembly 20 and a pair of clamp assemblies 30. In some embodiments of the present disclosure, the clamp assembly 30 includes one main clamp 31, two secondary clamps 32 and two supports 33. Referring to FIG. 1, two secondary clamps 32 are arranged to be adjacent to the main clamps 31. In some embodiments of the present disclosure, two secondary clamps 32 are substantially arranged to be adjacent two sides of one main clamp 31. Moreover, in some embodiments of the present disclosure, the length of the main clamp 31 is greater than the length of the secondary clamp 32. Thus, as shown in FIG. 1, the bottom of the secondary clamp 32 is higher than the bottom of the first clamp 31. Referring to FIG. 1, each main clamp 31 has a main clamp surface 311, and each secondary 32 has a secondary clamps surface 321. As shown in FIG. 2, the secondary clamp 32 align with the main clamp 31 and thus the main clamp surface 311 of the first clamp 31 and the secondary clamp surfaces 321 of the secondary clamps 32 may be substantially coplanar with each other. In addition, the secondary clamp 32 may further include a protrusion 322 protruded from the secondary clamp surface 321. Moreover, referring to FIG. 1, the supports 33 are arranged to be adjacent to the main clamps 31 as well. In some embodiments of the present disclosure, the supports 33 and the main clamp 31 are put together and the supports 33 are arranged at the sides of the first clamp 31. The support 33 is configured to move relative to the main clamp 31 and thus a support pin (also referred to a movable support pin) 332 of the support 31 retracts at the bottom of the main clamp 31 or projects from the bottom of the main clamp 31. FIG. 1 and FIG. 2 shows that the support pin 332 of the support 31 retracts at the bottom of the main clamp 31. As shown in FIGS. 1 and 2, when the support pin 332 of the support 31 retracts at the bottom of the main clamp 31, the support pin 332 of the support 31 does not project from the main clamps surface 311 of the main clamp 31.

The clamp assemblies 30 are connected to the transmission assembly 20. The transmission assembly 20 may be connected to a control module 101 (referring to FIG. 3, such as a processor, a computer, etc.). The control module 101 is configured to control the transmission assembly 20 such that two clamp assemblies 30 move relative to each other. In some embodiments of the present disclosure, two clamp assemblies are driven to move close to or away from each other. In some embodiments of the present disclosure, the transmission assembly 20 includes a rail 21, two sliders 22 and several driving members (not shown, such as step motor, belt, etc.). The sliders 22 are slidingly mounted on the rail 21, and the control module 101 is configured to control the sliders 22 to slide on the rail 21. In some embodiments of the present disclosure, the control module 101 may drive two sliders 22 to move simultaneously and thus two sliders 22 simultaneously move close to each other or simultaneously move away from each other. In some embodiments of the present disclosure, the control module 101 may drive one of the sliders to move and thus one of the sliders 22 moves close to the other or one of the sliders 22 moves away from the other. Further, as shown in FIGS. 1 and 2, the clamp assemblies 30 are mounted to the sliders 22, and thus two clamp assemblies 30 move close to each other or move away from each other as the sliders 22 move. That is, the clamp assemblies 30 are driven to move along the X-axis by the sliders 22. Therefore, a distance between the main clamp surfaces 311 and a distance between the secondary clamp surfaces could be adjusted by the control module 101. Since the clamp assembly 30 is mounted to the slider 22 and the slider 22 is configured to move the clamp assembly 30, the main clamp 31 and the secondary clamp 32 may, but is not limited to, move synchronously.

Figure 3:
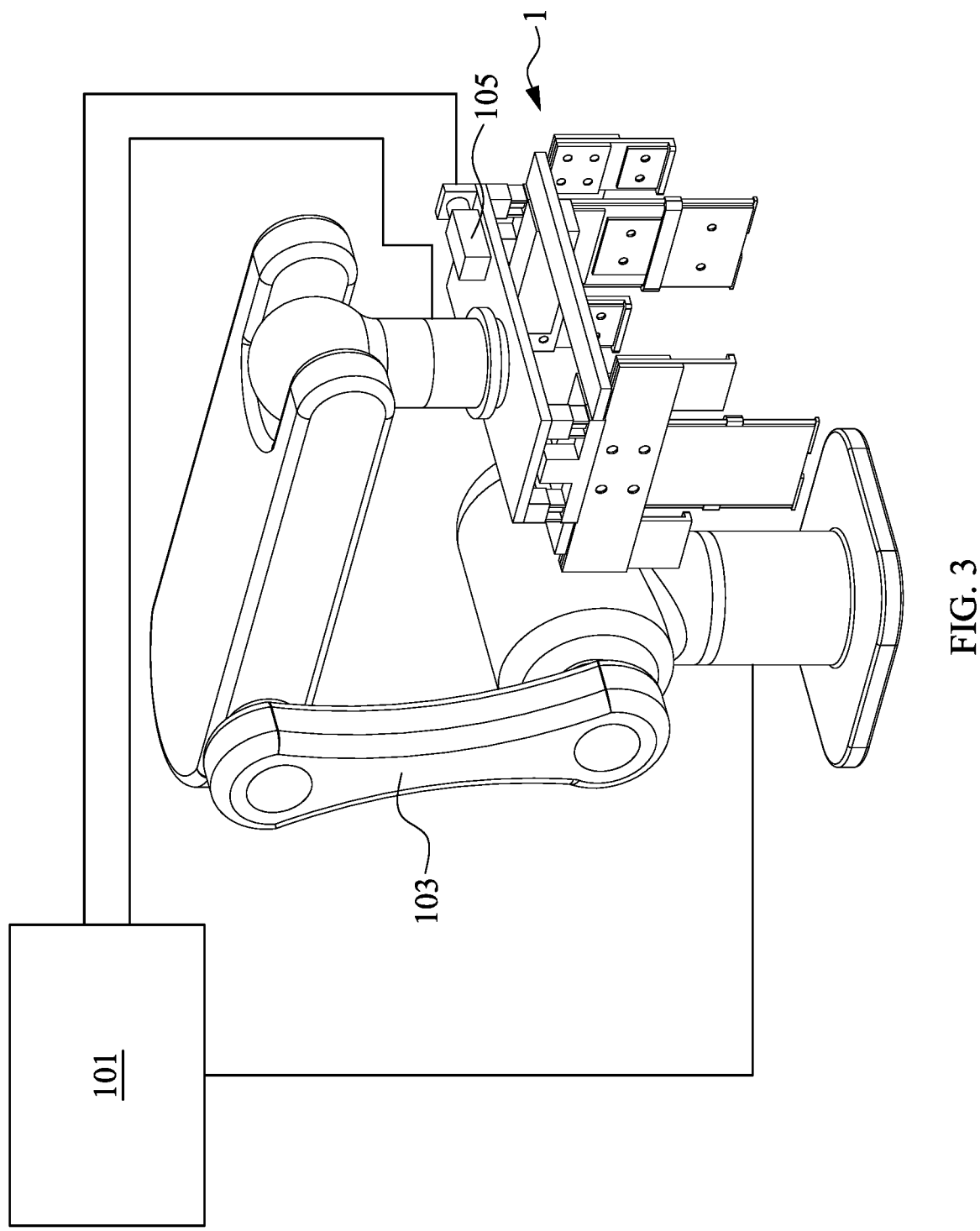
FIG. 3 illustrates a system of a robot gripper in accordance with some embodiments of the present disclosure.

Referring to FIG. 3, the robot gripper 1 may be connected to the control module 101. Further, the robot gripper 1 may be mounted to a robot arm 103, such as a six-axis robot arm 103. The robot arm 103 is configured to move and rotate the robot gripper 1. Further, the robot arm 103 may be electrically connected to the control module 101. Thus, the control module 101 is configured to control the robot arm 103 to move and rotate the robot gripper 1 to a specific position. In addition, a camera device 105 may be mounted on the robot gripper 1 and may be electrically connected to the control module 101. The camera device 105 is configured to capture images of an object that the robot gripper 1 will clamp and transfer such images to the control module 101. The control module 101 defines the location and the size of the object based on the images from the camera device 105 and drives the robot arm 103 and controls the robot gripper 1 to clamp and/or move the object.

Figure 4:
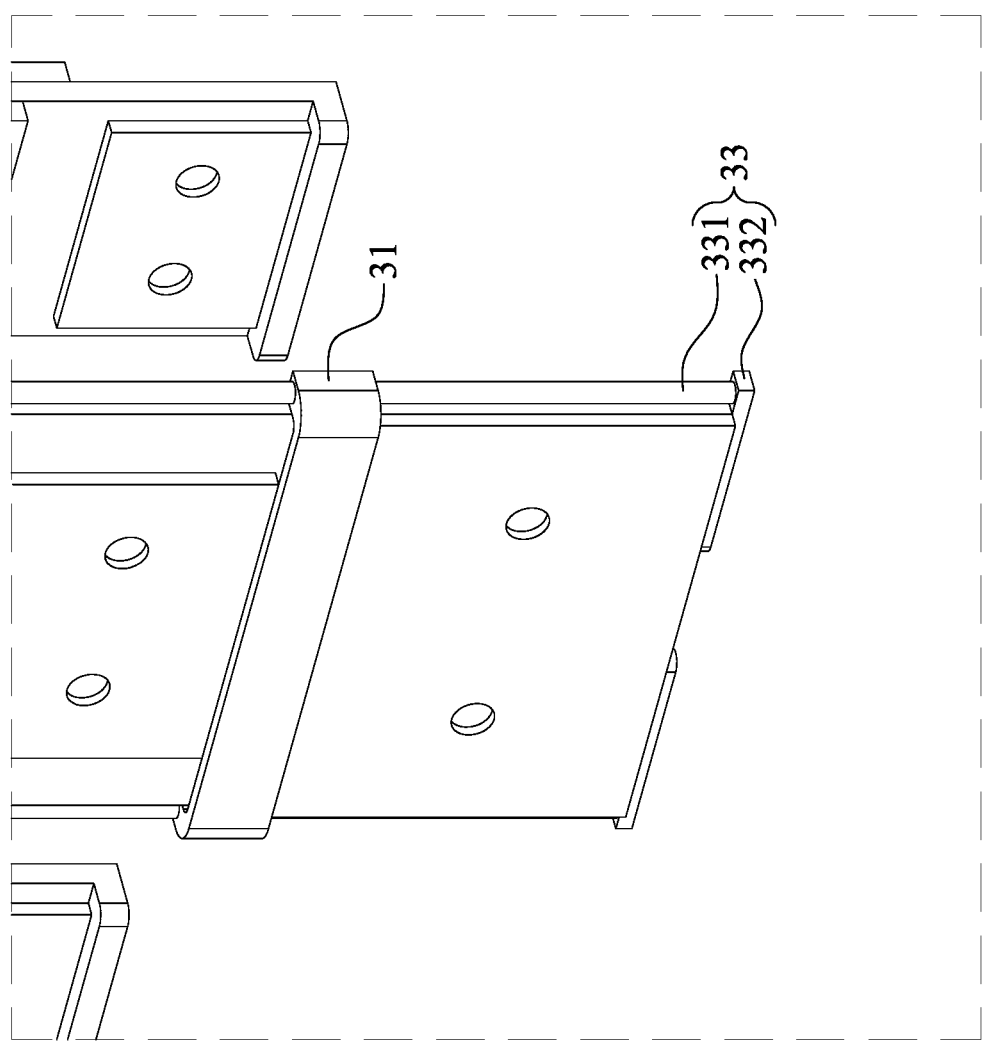
FIG. 4 is an enlarged view of portion "A" illustrated in FIG. 1.

FIG. 4 is an enlarged view of portion "A" illustrated in FIG. 1. As shown in FIG. 4, the main clamp 31 may include a board-shaped portion, and two supports 33 may be arranged at two sides of the main clamp 31. In some embodiments of the present disclosure, the support 33 includes an shaft 331 and a support pin 332. Referring to FIG. 4, the shaft 331 of the support 33 is arranged at the side surface of the main clamp 32 and substantially extends along a lengthwise of the main clamp 32. The support pin 332 is connected to the end of the shaft 331 and substantially arranged underneath the bottom of the main clamp 31. As shown in FIG. 4, the supports 33 are attached to the main clamp 31, and thus the supports 33 and the main clamp 31 are put together. Further, the support pin 332 is arranged to be close to the bottom of the main clamp 31 and extends along the bottom edge of the main clamp 31.

Figure 5A:
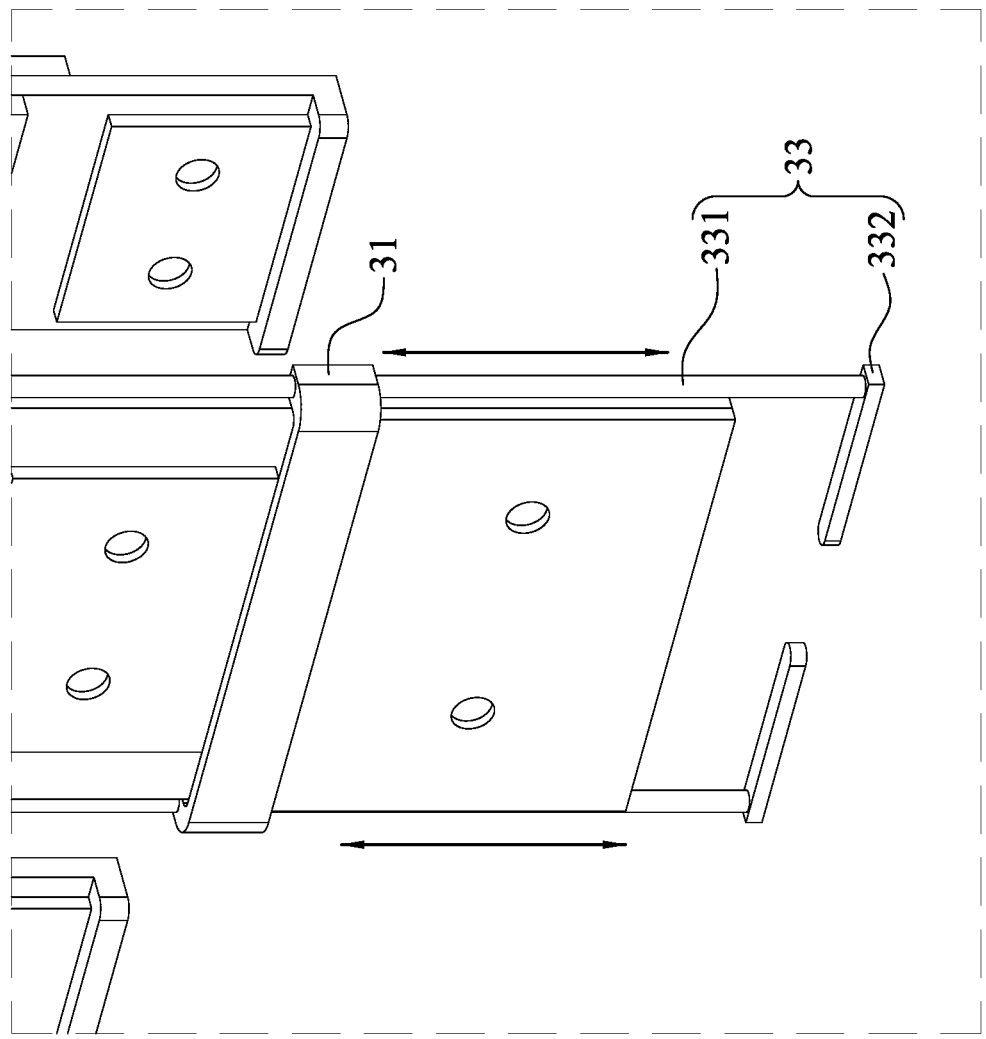
FIG. 5A illustrates a movement of supports of a robot gripper in accordance with some embodiments of the present disclosure.
Figure 5B:
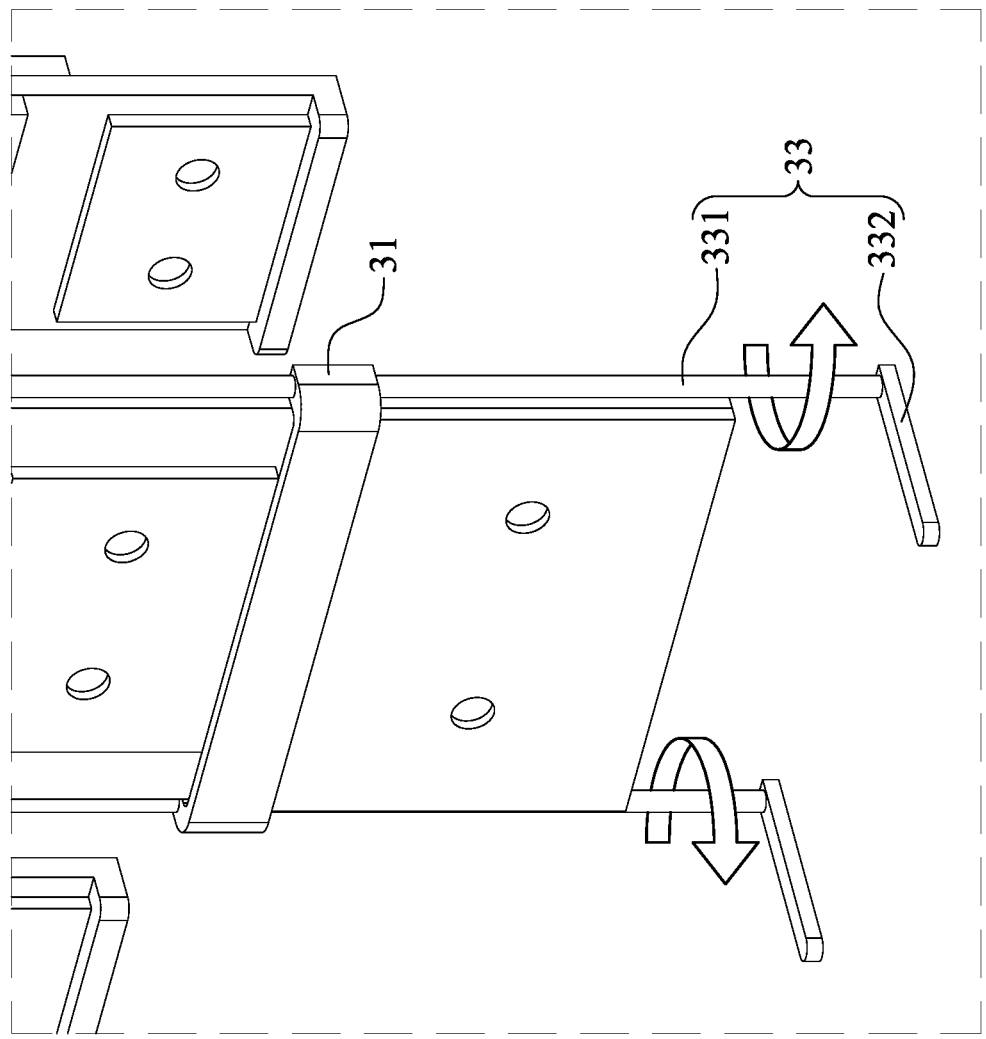
FIG. 5B illustrates another movement of supports of a robot gripper in accordance with some embodiments of the present disclosure.

The control module 101 is configured to drive the supports 33 to move relative to the main clamp 31. Referring to FIG. 5A, the control module 101 drives the supports 33 to move along the lengthwise direction of the main clamp 32. That is, the shafts 331 of the supports 33 are configured to move along the Z-axis, and thus the support pins 332 of the supports 3 are configured to move close to the bottoms of the main clamps 32 or away from the bottoms of the main clamps 32 accordingly. Referring to FIG. 5B, the control module 101 drives the shafts 331 of the supports 33 to rotate about an axis parallel to the lengthwise direction of the main clamp 32. By the rotation of the shaft 331 of the support 33, the support pin 332 of the support 33 is configured to rotate with respect to the bottom of the main clamp 31. As shown in FIG. 5B, the support pin 332 of the support 33 rotates from extending along the direction which is substantially parallel to the main clamps surface 311 (Y-axis direction), to extending along the direction which is substantially perpendicular to the main clamp surface 311 (X-axis direction). Moreover, since the first clamps 31 are arranged to be opposite to each other (referring to FIGS. 1 and 2), the support pins 332 of the first clamps 31 will extend toward each other when they are substantially perpendicular to the main clamp surface 311. Given the above, the support pin 332 is driven to move close to or away from the main clamp 32 and the support pin 332 is also driven to rotate with respect to the main clamp 32. That is, the support pin 332 is configured to retract at the bottom of the main clamp 32 (referring to FIG. 4) or to project from the bottom of the main clamp 32 as well (referring to FIG. 5A and/or FIG. 5B). Therefore, when the user does not need to use the support pin 332, the user can control the control module 101 to retract the support pin 332 at the bottom of the main clamp 31. When the user needs to use the support pin 332, the can control the control module 101 to project the support pin 332 from the bottom of the main clamp 31. In some embodiments of the present disclosure, the support pin 332 is connected to the shaft 331, and thus the control module 101 drives the shaft to move or to rotate with respect to the main clamp 31 so as to retract the support pin 332 at the bottom of the main clamp 31 or to project the support pin 332 from the bottom of the main clamp 31.

Figure 6A:
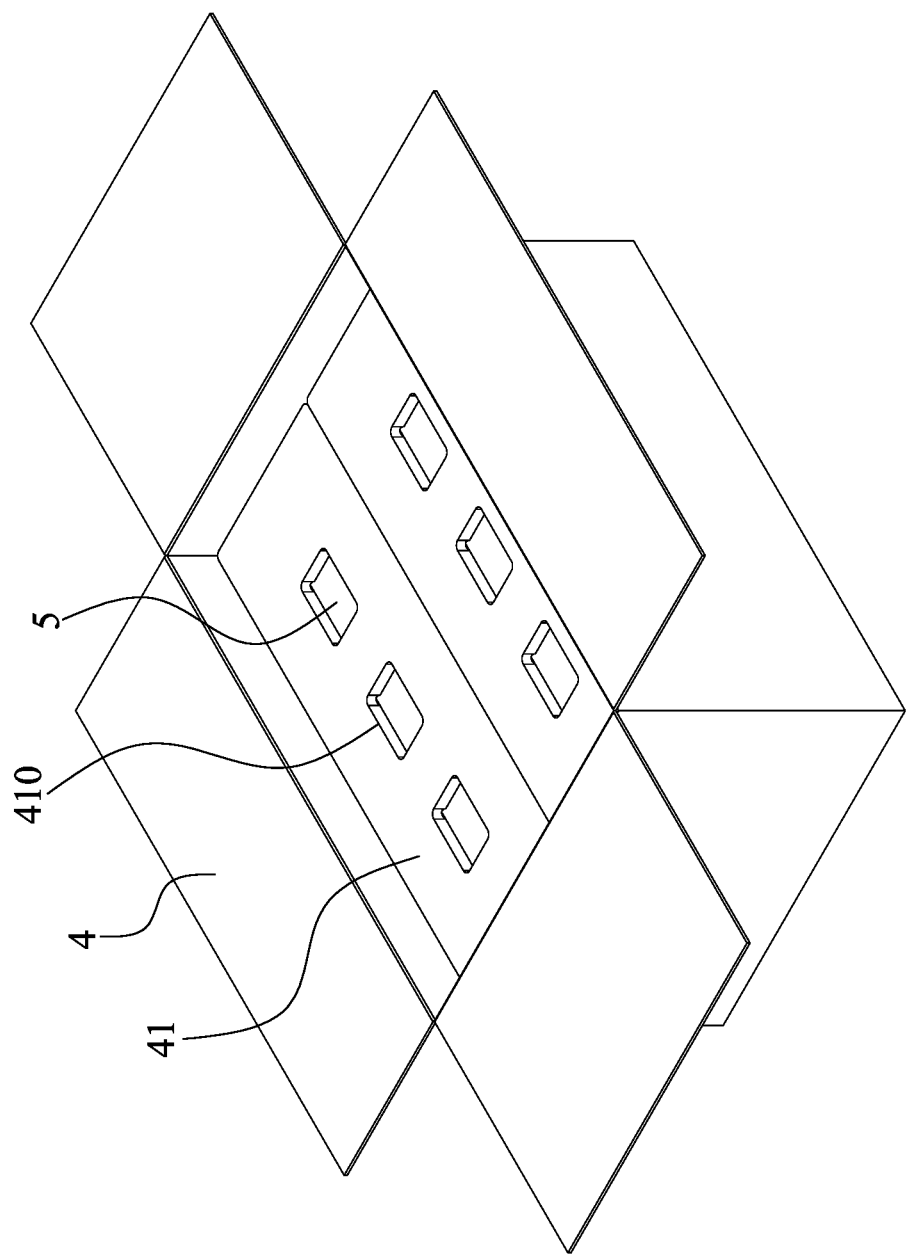
FIG. 6A illustrates an exemplary embodiment of a packing container loaded with wafer carriers and packing materials.
Figure 6B:
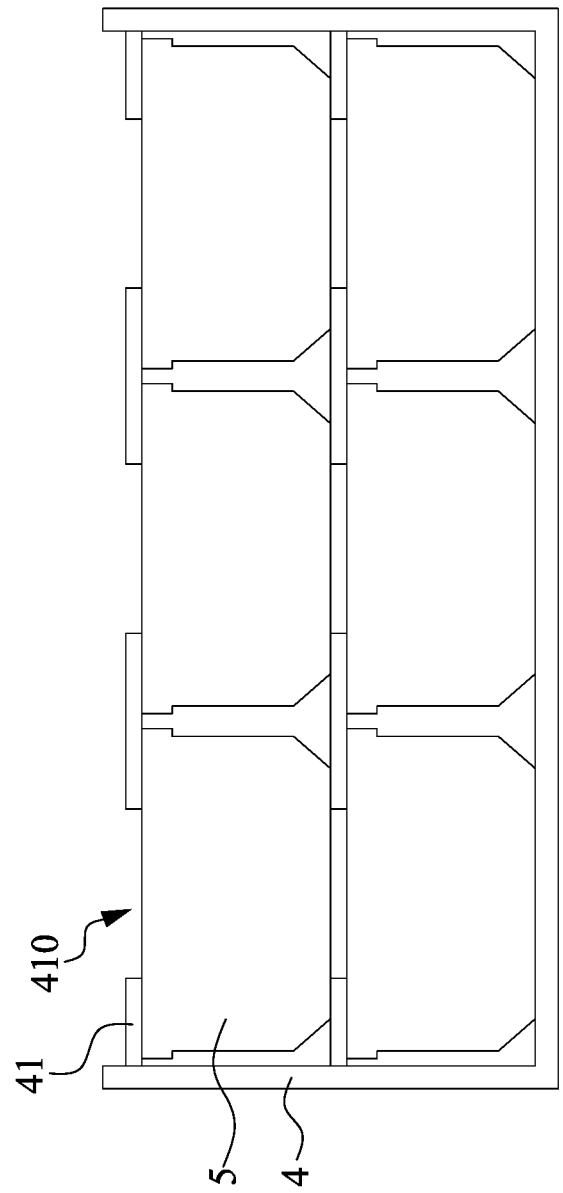
FIG. 6B is a schematic cross-sectional view of an exemplary embodiment of a packing container loaded with wafer carriers and packing materials.

FIG. 6A illustrates an exemplary embodiment of a packing container loaded with wafer carriers and packing materials. FIG. 6B is a schematic cross-sectional view of an exemplary embodiment of a packing container loaded with wafer carriers and packing materials. As above-mentioned, wafer suppliers may use wafer carriers 5, such as Front-opening shipping boxes (FOSB), to ship wafers to a customers. After the wafers are loaded into a number of wafer carriers 5, the wafer carriers 5 are packaged in a packing container 4 and then the wafer suppler transports the packing container 4 to the customer. Generally, the wafer suppliers may further put some packing materials 41 into the packing container 4 to fixedly hold the wafer carriers 5 and protect the wafer carriers 5 from damage when they package the wafer carriers 5 into the packing container 4. The packing materials 41 may be arranged on the wafer carriers 5 and/or between the wafer carriers 5. In some embodiments of the present disclosure, the packing material 41 includes several through holes 410. That is, when the customer receives the packing container 4 loaded with the wafer carriers 5, the customer should remove the packing material 41 first and then take the wafer carriers 5 out of the packing container 4.

FIG. 7A, FIG. 7B, FIG. 7C, FIG. 7D and FIG. 7E illustrate a method of removing a packing material from a packing container, in accordance with some embodiments of the present disclosure.

Figure 7A:
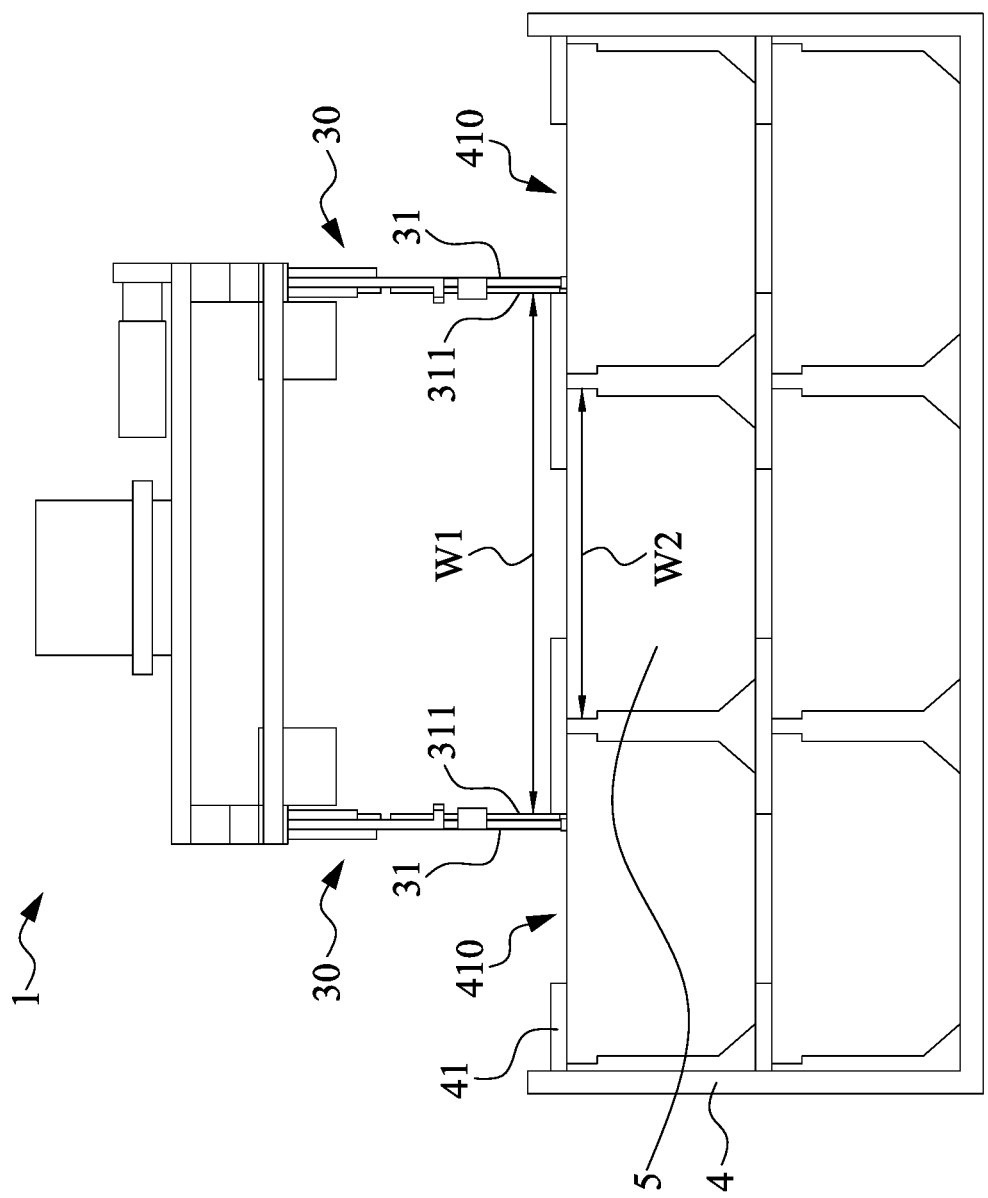
FIG. 7A, FIG. 7B, FIG. 7C.

Referring to FIG. 7A, the control module 101 drives the robot arm 105 and two clamp assemblies 30 of the robotic gripper 1 to move relative to each other such that two main clamp surfaces 311 of the main clamps 31 respectively engage side surfaces of two through holes 410 of the packing material 41. As shown in FIG. 7A, the main clamps 31 are driven to extend into the through holes 410 of the packing material 41 and respectively engage the side surfaces of the through holes 410 of the packing material 41. The distance W1 between the through holes 410 of the packing material 41, which are respectively engaged by the main clamp surfaces 311 of the main clamps 31, is greater than a width W2 of the wafer carrier 5.

Figure 7B:
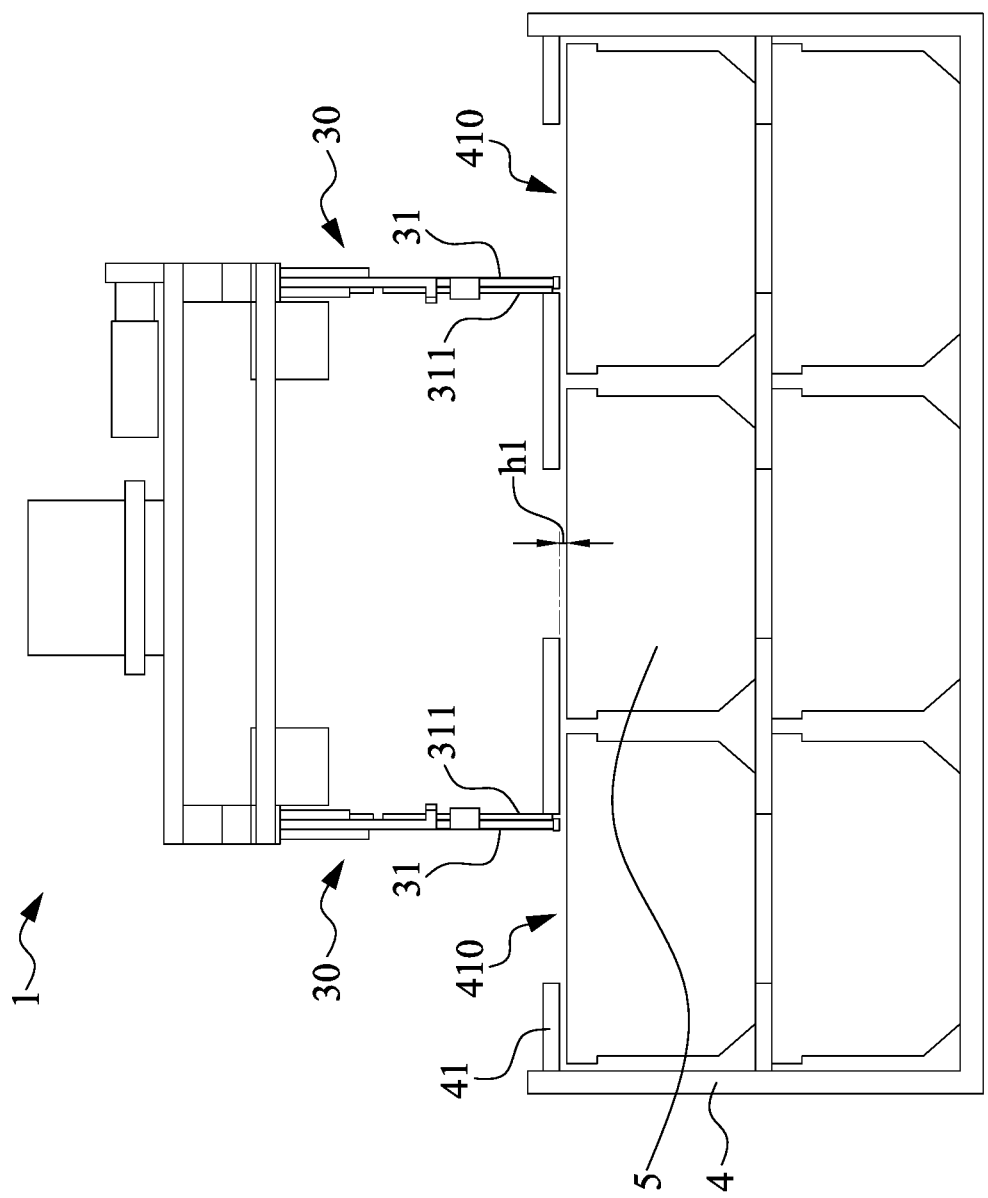

Referring to FIG. 7B, the control module 101 drives the robot arm 103 to move the robot gripper 1 up to a height h1. Further, since the packing material 41 is engaged by the main clamps surfaces 311 of the robot gripper 1, the packing material 41 is lifted up to the height h1 accordingly. After the packing material 41 is lifted up to the height h1, there is a space between the packing material 41 and the wafer carriers 5. In some embodiments of the present disclosure, the packing material 41 is tightly received in the packing container 4. Thus, when the robot gripper 1 is moved up to the height h1, the packing material 41 may not be lifted up accordingly but may deform and bulge in the middle. However, as a result, a space is created between the packing material 41 and the wafer carriers 5 as well. In other words, the control module 101 drives the robot arm 103 to move the robot gripper 1 up to a height h1 so as to create a space between the packing material 41 and the wafer carriers 5.

Figure 7C:
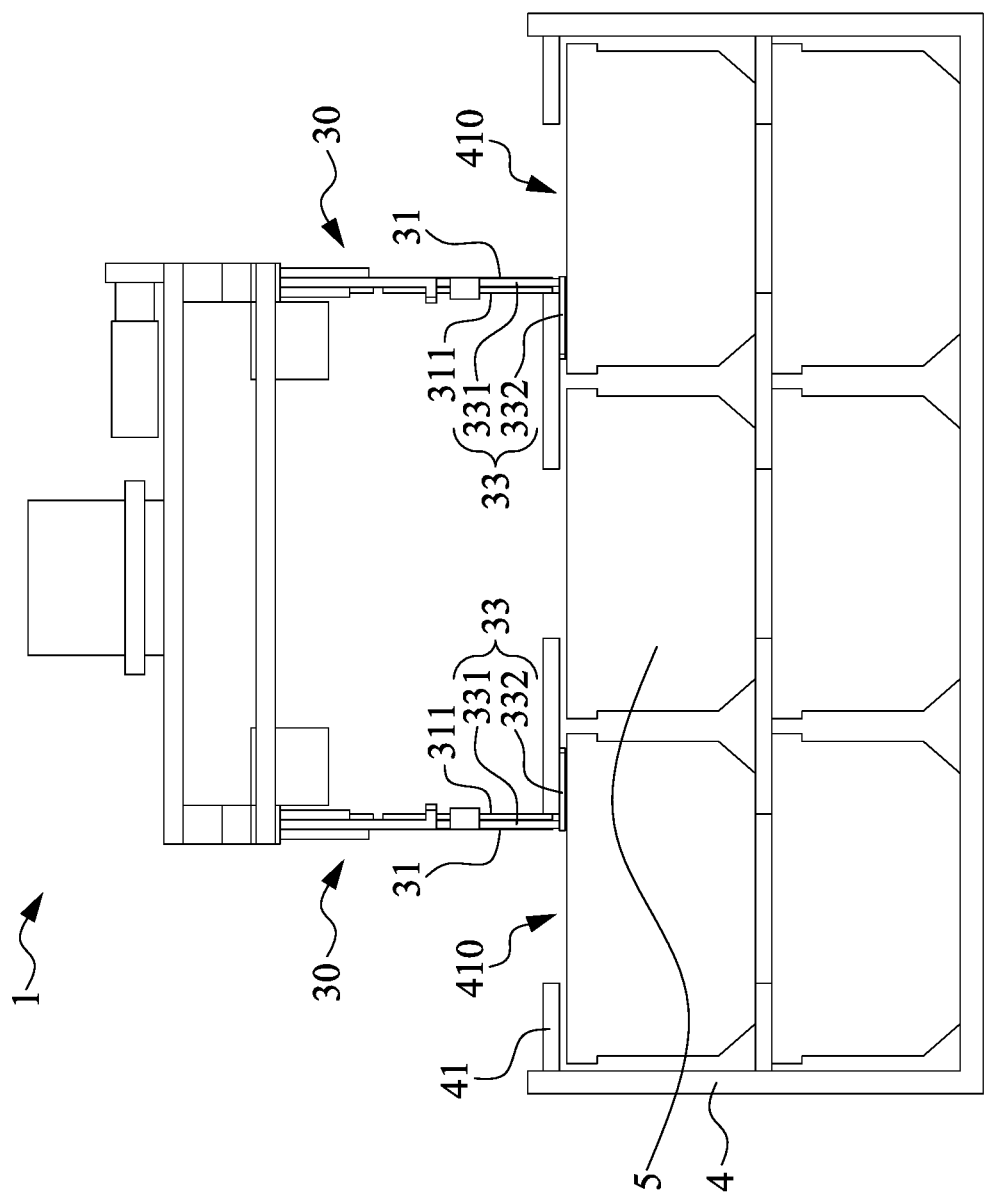

Referring to FIG. 7C, the control module 101 drives the support pin 332 to move away from the bottom of the main clamp 31 and thus the support pins 332 moves downwardly from the bottom of the main clamp 31. Then the control module 101 drives the support pin 332 to rotate with respect to the main clamp 31 and thus the support pin 332 projects from the bottom of the main clamp 31. As shown in FIG. 7C, the support pin 332 is driven to extend underneath the bottom of the packing material 41, and thus the support pin 32 is configured to contact and support of the bottom of the packing material 41. Further, since the support pin 332 is driven to extend underneath the bottom of the packing material 41, the support pin 32 would extend into the space between the packing material 41 and the wafer carriers 5. Therefore, the height h1 is equal to or greater than a thickness of the support pin 332.

Figure 7D:
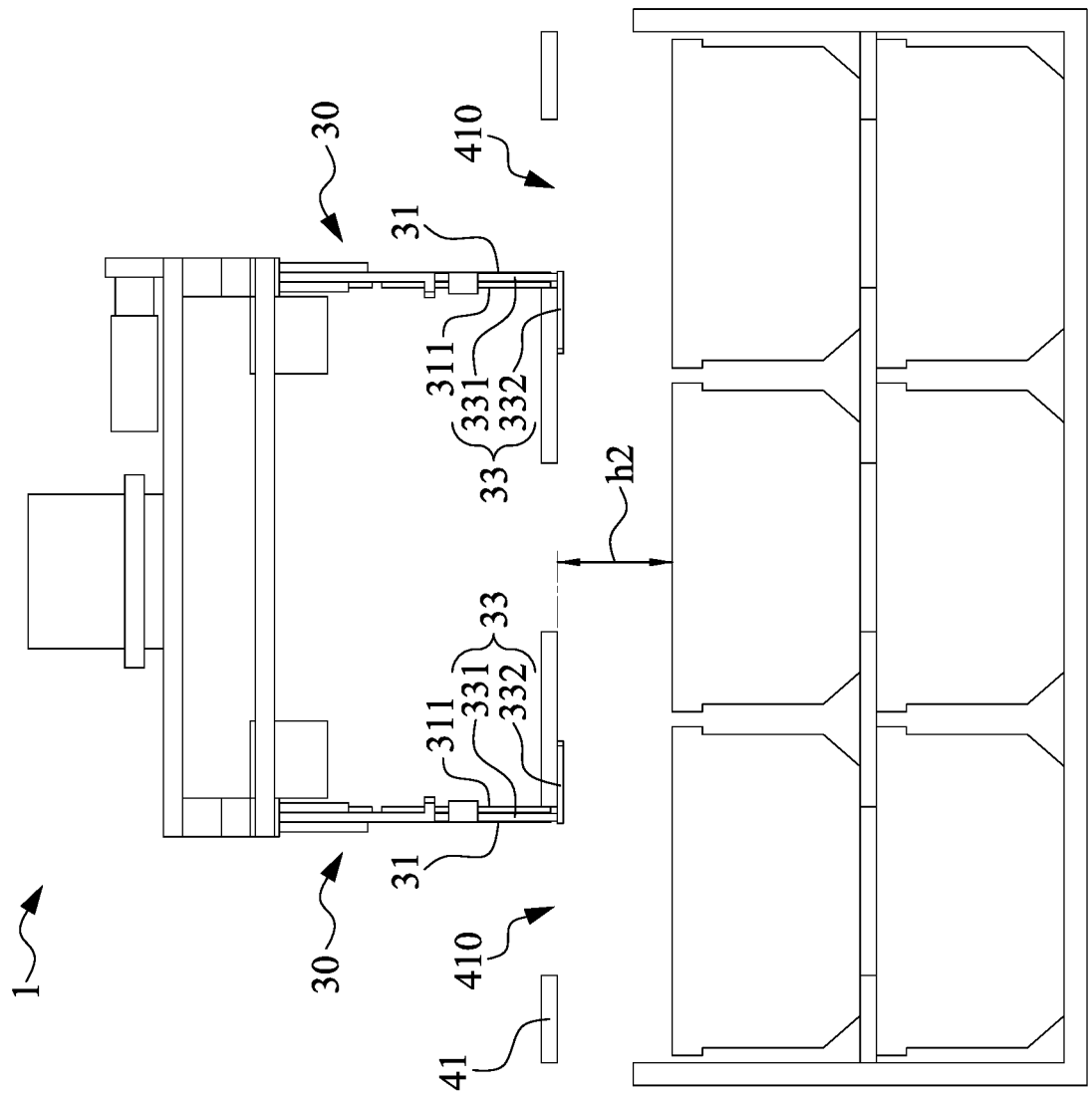
FIG. 7D and FIG. 7E illustrate a method of removing a packing material from a packing container, in accordance with some embodiments of the present disclosure.

Referring to FIG. 7D, the control module 101 drives the robot arm 103 to move the robot gripper 1 up to a height h2. The packing material 41 is lifted up to the height h2 accordingly. As shown in FIG. 7D, when the packing material 41 is lifted up to the height h2, the packing material 41 is totally removed from the packing container 4.

When the robot gripper 1 lifts up the packing material 41 to the height h2, the robot gripper not only clamps the packing material 41 by the main clamps 31 but also supports the packing material 41 by the supports 33. That is, the main clamp surfaces 311 of the main clamp 31 of the robot gripper 1 apply a clamp force on the side surfaces of the through holes 410 of the packing material 41 and the support pins 332 of the supports 33 of the robot gripper 1 apply an upward force on the bottom of the packing material 41 while removing the packing material 41 from the packing container 4. Since the support pins 332 contact and support the bottom surface of the packing material 41, the support pins 332 give support at the bottom of the packing material 41. In other words, an upward force is applied on the bottom surface of the packing material 41. Thus, the packing material 41 will be easily lifted up and will not be damaged during handling. If there is no support pin 332 to contact and support the bottom surface of the packing material 41, the main clamp surfaces 311 of the robot gripper need to apply a greater force to engage and clamp the packing material 41. Once the main clamp surfaces 311 applies an excess force to engage and clamp the packing material 41, the packing material 41 may be crushed and damaged due to the excess force applied by the main clamp surfaces 311.

Figure 7E:
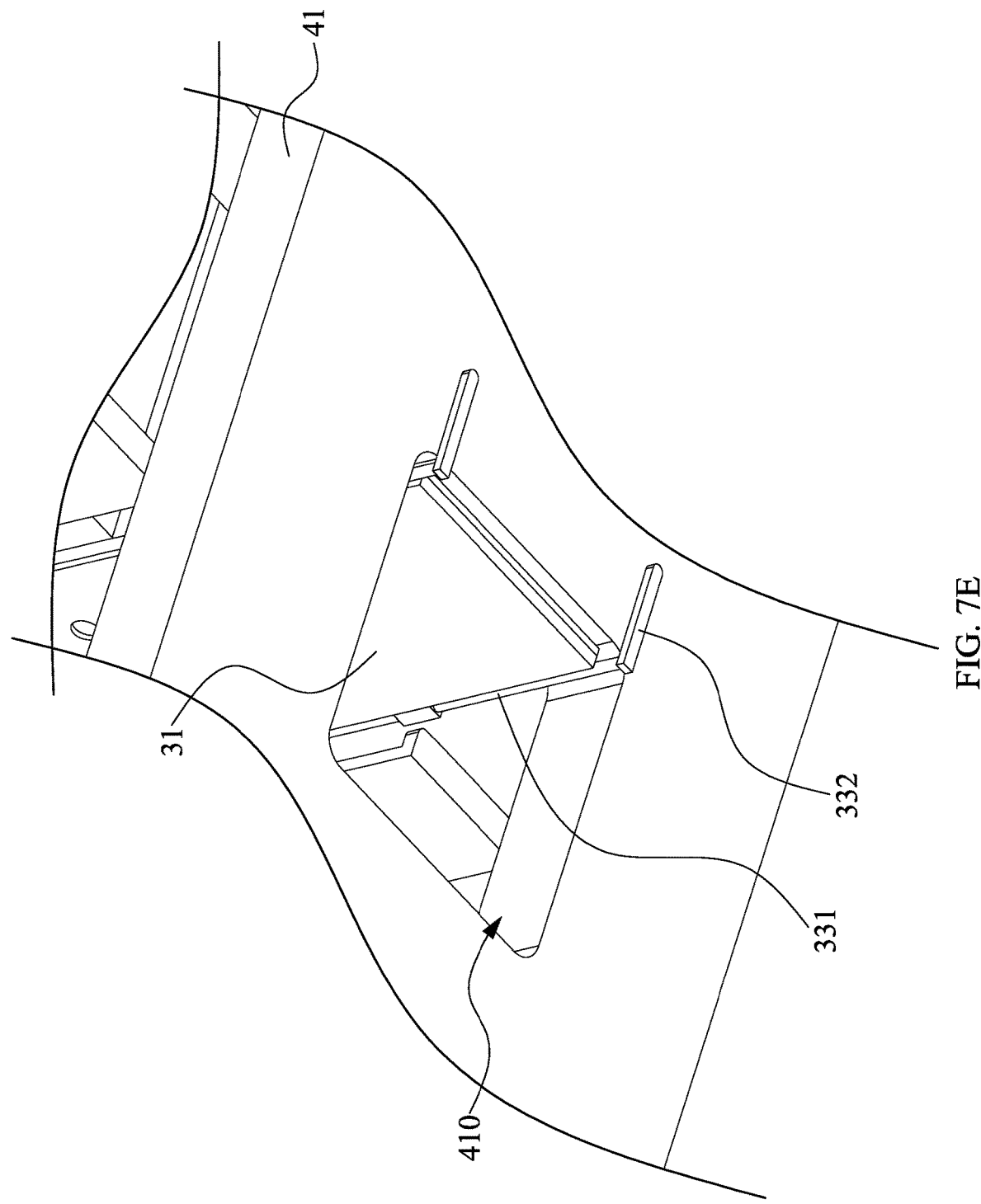

FIG. 7E shows that the support pins 332 contact and support the bottom surface of the packing material 41. As shown in FIG. 7E, the main clamp 31 passes through the through hole 410 of the packing material 41 and engages the side surface of the through hole 410 of the packing material 41. The support pins 332 project from the bottom of the main clamp 31 and extend underneath the bottom surface of the packing material 41 and thus the support pin 332 is configured to support and contact the bottom surface of the packing material 41 when the robot gripper 1 lifts up the packing material 41. Moreover, according to FIG. 7E, it can be understood that the support pin 332 needs to move far away from the bottom of the main clamp 31 first and then rotates to extend underneath the bottom of the packing material 41 after the robot gripper 1 lifts the packing material 41 up to the height h1 as shown in FIG. 7B.

Figure 8A:
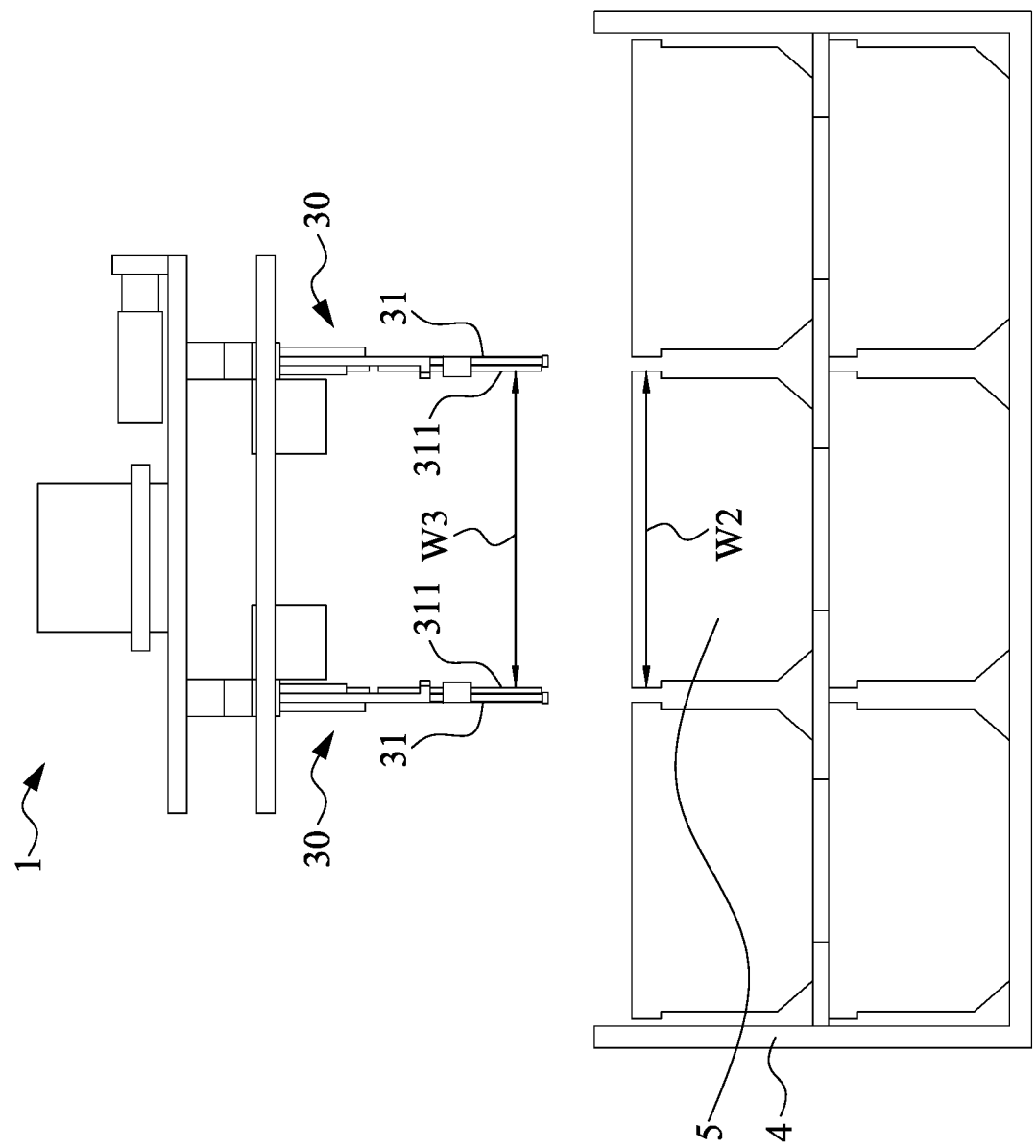
FIG. 8A.
Figure 8B:
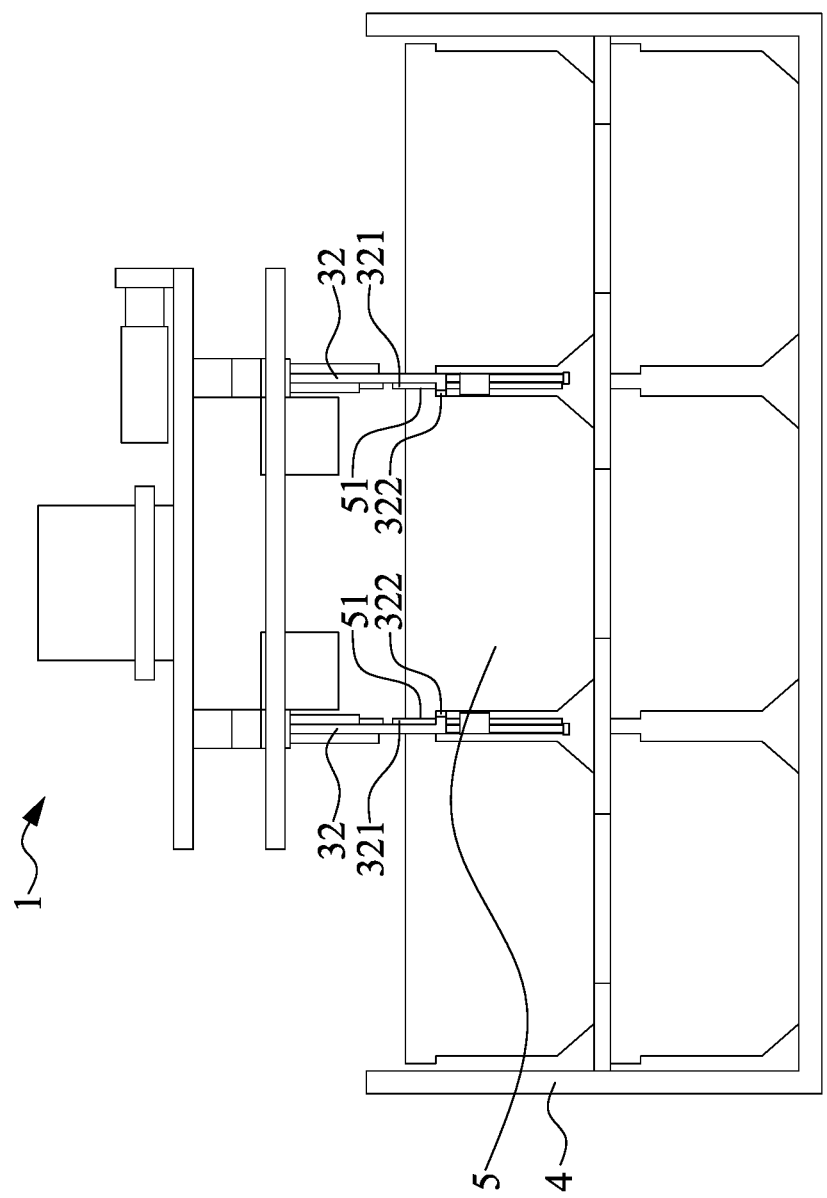

FIG. 8A, FIG. 8B and FIG. 8C illustrate a method of removing a wafer carrier from a packing container, in accordance with some embodiments of the present disclosure.

Referring to FIG. 8A, after removing the packing material 41, the wafer carriers 5 are not covered by the packing material 41 and could be directly clamped by the robot gripper 1. As shown in FIG. 8A, the control module 101 drives two clamp assemblies 30 of the robot gripper 1 to move relative to each other such that a distance W3 between two clamp assemblies 30 is substantially equal to the width W2 of the wafer carrier 5. Meanwhile, the control module 101 drives the supports 33 such that the support pins 332 of the supports 33 are moved to be received under the bottoms of the main clamps 31.

Referring to FIG. 8B, the control module 101 drives the robot arm 103 to downwardly move the robot gripper 1 and then drives the clamp assemblies 30 of the gripper 1 such that the secondary clamp surfaces 321 of the secondary clamp 32 engage the side surfaces of the wafer carrier 5. In some embodiments of the present disclosure, the main clamp surface 311 is coplanar with the secondary clamp surface 321. Thus, when the secondary clamp surfaces 321 engage the side surfaces of the wafer carrier 5, the main clamp surfaces 311 may engage the side surfaces of the wafer carrier 5 as well. As shown in FIG. 8B, the protrusions 322 of the secondary clamps 32 engage the flange 51 of the wafer carrier 5 such that the robot gripper 1 clamps the wafer carrier 5 more tightly.

Referring to FIG. 8C, the control module 101 drives the robot arm 103 to move the robot gripper 1 up. The wafer carrier 5 clamped by the gripper 1 is moved up as well. Then the control module 101 drives the robot arm 103 to take the wafer carrier 5 out of the packing container 4.

Figure 9:
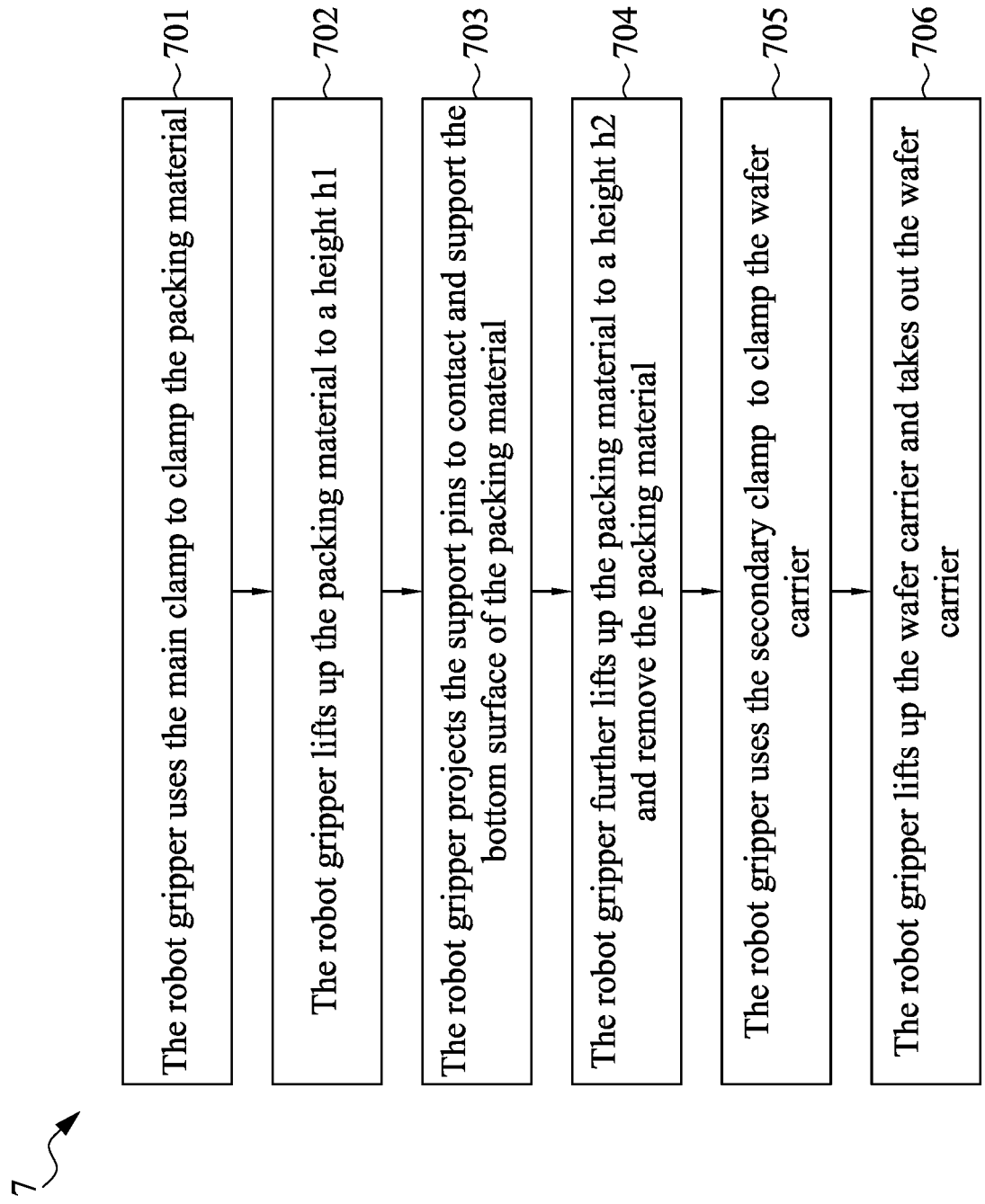
FIG. 9 is a flow chart representing exemplary operations of the method for removing a packing material and a wafer carrier from a packing container, in accordance with some embodiments of the present disclosure.

FIG. 9 is a flow chart representing exemplary operations of the method for removing a packing material and a wafer carrier from a packing container, in accordance with some embodiments of the present disclosure.

In Operation 701, the camera device 105 captures images of the packing materials 41 received in the packing container 4 and transfer such images to the control module 101. Based on the images from the camera device 105, the control module 101 moves the robot arm 103 and adjusts the distance between the main clamps 31 of the robot gripper 1 such that the main clamps 31 respectively extend into two of the through holes 410 of the packing material 41 and respectively engage the side surfaces of two through holes 410 of the packing material 41. Since the packing material may be soft and/or flexible, the main clamps 31 cannot apply an excess force to clamp the packing material 41 that the packing material 41 may be crushed and/or damaged.

In Operation 702, the control module 101 controls the robot arm 103 such that the robot gripper 1 is moved up to a height h1. Since the main clamps 31 of the robot gripper engage the packing material 41, the packing material 41 is moved up to the height h1 accordingly when the robot gripper 1 is moved up. After the packing material 41 is moved up, there is a space between the packing material 41 and the wafer carriers 5. In some embodiments of the present disclosure, the packing material 41 is tightly received in the packing container 1. Therefore, the packing material 41 may not move up accordingly but deforms and bulges in the middle when the robot gripper 1 moves up. If the packing material 41 deforms and/or bulges in the middle, there is a space between the packing material 41 and the wafer carriers 5.

In Operation 703, the control module 101 controls the robot gripper 1 such that the support pins 332 projects from the bottoms of the main clamps 31 and contacts and supports the bottom of the packing material 41. First, the control module 101 drives the shaft 331 of the support 31 to move along a lengthwise direction of the main clamp 31 and thus the support pin 332 moves far away from the bottom of the main clamp 31. Then the control module 101 drives the shaft 331 of the support 31 to rotate and thus the support pin 332 extends underneath the bottom of the packing material 41.

In Operation 704, the control module 101 controls the robot arm 103 such that the robot gripper 1 is moved up to a height h2. The height h2 may be much greater than the height h1. When the robot gripper is moved up to a height h2, the packing material 41 is moved up to height h2 accordingly and thus removed from the packing container 4.

After removing the packing material 41 from the packing container 4, the wafer carriers 5 received in the packing container 4 and covered by the packing material 41 are visible. In Operation 705, the camera device 105 captures images of the wafer carriers 5 received in the packing container 4 and transfer such images to the control module 101. Based on the images from the camera device 105, the control module 101 moves the robot arm 103 and adjusts the distance between the secondary clamps 32 of the robot gripper 1 such that the secondary clamps 32 engage the side surfaces of the wafer carrier 5.

In Operation 705, the control module 101 controls the robot arm 103 so as to lift up the wafer carrier 5 which is engaged by the robot gripper and take the wafer carrier out of the packing container 4.

It will be further appreciated that the foregoing apparatus may be used for clamping the packing material and the wafer carrier received in the packing container and removing the packing material and the wafer carrier from the packing container. The user may use the foregoing apparatus to remove the packing material and the wafer carrier from the packing container instead of using two different devices to remove the packing material and the wafer carrier from the packing container respectively. In addition, the foregoing apparatus may prevent the packing material from being damaged and/or crushed.

According to some embodiments of the present disclosure, a gripper mechanism includes two opposing clamp assemblies. The two clamp assemblies are configured to move close to or away from each other. Each of the clamp assemblies includes a movable support pin at a bottom of the clamp assembly.

According to some other embodiments of the present disclosure, a gripper mechanism includes a couple of movable first clamps configured to clamp an object. Each of the first clamps includes at least one movable support pin configured to support a bottom surface of the object.

According to still some other embodiments of the present disclosure, a method of transferring a wafer carrier includes the following operation. A packing material is clamped by first clamps of a gripper mechanism. The packing material is lifted by the gripper mechanism up to a first height. Support pins are moved to contact a bottom surface of the packing material. The packing material is lifted by the gripper mechanism up to a second height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gripper mechanism, comprising:
a first clamp assembly having a first support pin at a bottom of the first clamp assembly; and
a second clamp assembly arranged opposite to the first clamp assembly and having a second support pin at a bottom of the second clamp assembly;
wherein the first and second clamp assemblies are configured to move close to or away from each other;
wherein the first support pin is configured to move relative to the bottom of the first clamp assembly and the second support pin is configured to move relative to the bottom of the second clamp assembly;
wherein the first support pin is configured to move close to or away from the bottom of the first clamp assembly and rotate with respect to the bottom of the first clamp assembly, and the second support pin is configured to move close to or away from the bottom of the second clamp assembly and rotate with respect to the bottom of the second clamp assembly;
wherein the first support pin is configured to rotate from extending along a bottom edge of the first clamp assembly to extending toward the second support pin, and the second support pin is configured to rotate from extending along a bottom edge of the second clamp assembly to extending toward the first support pin.

2. The gripper mechanism of claim 1, wherein the first support pin is configured to extend along a lengthwise direction of the first clamp assembly, and wherein the second support pin is configured to extend along a lengthwise direction of the second clamp assembly.

3. The gripper mechanism of claim 1, wherein the first clamp assembly comprises a first main clamp and the first support pin is arranged at a bottom of the first main clamp, and wherein the second clamp assembly comprises a second main clamp and the second support pin is arranged at a bottom of the second main clamp.

4. The gripper mechanism of claim 3, wherein the first clamp assembly comprises a first secondary clamp, Which substantially aligns with the first main clamp, and the first secondary clamp comprises a first protrusion, and wherein the second clamp assembly comprises a second secondary clamp, which substantially aligns with the second main clamp, and the second secondary clamp comprises a second protrusion.

5. The gripper mechanism of claim 4, wherein a vertical height of the first protrusion is different from a vertical height of the first support pin, and wherein a vertical height of the second protrusion is different from a vertical height of the second support pin.

6. The gripper mechanism of claim 5, wherein the vertical height of the first protrusion is higher than the vertical height of the first support pin, and wherein the vertical height of the second protrusion is higher than the vertical height of the second support pin.

7. The gripper mechanism of claim 4, wherein the first protrusion protrudes from the first secondary clamp and toward the second protrusion, and wherein the second protrusion protrudes from the second secondary clamp and toward the first protrusion.

8. A gripper mechanism, comprising:
a pair of first clamps configured to clamp a first workpiece, wherein each of the first clamps has at least one movable support pin configured to support a bottom surface of the first workpiece; and
a pair of second clamps configured to clamp a second workpiece,
wherein the movable support pin is configured to rotate from extending along a first direction, which is substantially parallel to a clamp surface of the first clamp, to extending along a second direction, which is different from the first direction.

9. The gripper mechanism of claim 8, wherein the movable support pin is arranged adjacently to a bottom of the first clamp.

10. The gripper mechanism of claim 8, wherein a distance between the first clamps is a first distance while the first clamps clamp the first workpiece and a distance between the second clamps is a second distance while the second clamps clamp the second workpiece, and wherein the first distance is greater than the second distance.

11. The gripper mechanism of claim 8, wherein each of the first clamps has a clamp surface for engaging a side surface of a through hole of the first workpiece, and wherein the movable support pin is configured to extend underneath the bottom surface of the first workpiece.

12. The gripper mechanism of claim 7, wherein each of the second clamps has a clamp surface for engaging a side surface of the second workpiece.

13. The gripper mechanism of claim 12, wherein each of the second clamps has a protrusion protruding from the clamp surface to engage with a flange at the side surface of the second workpiece.

14. The gripper mechanism of claim 13, wherein the protrusion is arranged above the movable support pin.

15. The gripper mechanism of claim 8, wherein the pair of first clamps and the pair of second clamps are configured to move synchronously.

16. A method of transferring a packing material and a wafer carrier, comprising:
clamping a packing material by a pair of first clamps of a gripper mechanism;
lifting the packing material by the pair of the first clamps up to a first height;
extending support pins from bottoms of the pair of first clamps to support a bottom surface of the packing material;
removing the packing material by lifting the packing material by the pair of first clamps and the support pins up to a second height; and
clamping a wafer carrier by a pair of second clamps of the gripper mechanism subsequent to removing the packing material.

17. The method of claim 16, wherein a distance between the pair of first clamps is controlled to a first distance to clamp the packing material, and a distance between the pair of second clamps is controlled to a second distance to clamp the wafer carrier, and wherein the first distance is greater than the second distance.

18. The method of claim 16, wherein the support pin is moved away from the bottom of the first clamp and rotated to extend underneath the bottom surface of the packing material while extending support pins from the pair of first clamps to support the bottom surface of the packing material.

19. The method of claim 16, wherein the support pin is retracted at the bottom of the first clamp while clamping the wafer carrier by the pair of second clamps of the gripper mechanism.

20. The method of claim 16, further comprising engaging flanges at side surfaces of the wafer carrier by protrusions of the pair of second clamps.

\* \* \* \* \*